(12) United States Patent
He

(10) Patent No.: US 7,841,893 B2
(45) Date of Patent: Nov. 30, 2010

(54) PORTABLE ELECTRONIC DEVICE

(75) Inventor: Tao He, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/467,307

(22) Filed: May 18, 2009

(65) Prior Publication Data
US 2009/0305552 A1 Dec. 10, 2009

(30) Foreign Application Priority Data
Jun. 6, 2008 (CN) .................. 2008 1 0302059

(51) Int. Cl.
*H01R 13/72* (2006.01)
(52) U.S. Cl. ...................... 439/501; 439/135
(58) Field of Classification Search ............... 439/501, 439/135
See application file for complete search history.

(56) References Cited

U.S. PATENT DOCUMENTS

| | | | | |
|---|---|---|---|---|
| 5,214,368 A | * | 5/1993 | Wells | 320/105 |
| 5,669,471 A | * | 9/1997 | Unze | 191/12.2 R |
| 6,331,121 B1 | * | 12/2001 | Raeford, Sr. | 439/501 |
| 6,623,294 B2 | * | 9/2003 | Tse et al. | 439/501 |
| 6,702,608 B2 | * | 3/2004 | Brennan, Jr. | 439/501 |
| 6,942,519 B2 | * | 9/2005 | Chen | 439/501 |

\* cited by examiner

*Primary Examiner*—Truc T Nguyen
(74) *Attorney, Agent, or Firm*—Frank R. Niranjan

(57) ABSTRACT

A portable electronic device includes a main body, a compartment and a transmission line. The transmission line has a cable and a connector part. One end of the cable is electrically connected to the main body, and the other end of the cable extends out from the main body and is connected to the connector part. The compartment defines a receiving space therein. The compartment is pivotally connected to one end of the main body and has a closed position and an open position relative to the end of the main body. The connector part and the cable are received in the receiving space and concealed by the compartment when the compartment is in the closed position. The connector part is detachably connected to an external device with the cable being pulled out from the receiving space of the compartment when the compartment is in the open position.

10 Claims, 5 Drawing Sheets

PORTABLE ELECTRONIC DEVICE

BACKGROUND

1. Technical Field

The present disclosure is related to portable electronic devices, and particularly to a portable electronic device with a transmission line held therein.

2. Description of Related Art

Most electrical connectors are widely used to connect two electronic devices for data communication and/or power transfer between the two electronic devices. Most connectors include two parts, a plug and a port. For example, a universal serial bus (USB) connector is used to connect a portable electronic device with a host computer. Each USB connector includes a USB port and a USB plug. A USB port is often mounted on the portable electronic device and another USB port mounted on the host computer. For establishing an electrical connection between the portable electronic device and the host computer, a transmission line or cable having two USB plugs attached to each end of the cable, may be used. The two USB plugs are respectively inserted into the USB ports of the portable electronic device and the host computer, thus data can be transmitted between the portable electronic device and the host computer. When not in use, the USB cable and plugs must be stored away and be available for easy use. However, after being stored away and not used for an extended period of time, the user may forgot where he stored the USB cable, further transporting the USB cable may also be an inconvenience.

What is needed, therefore, is a portable electronic device to overcome the described limitations.

DETAILED DESCRIPTION

Figure 1:
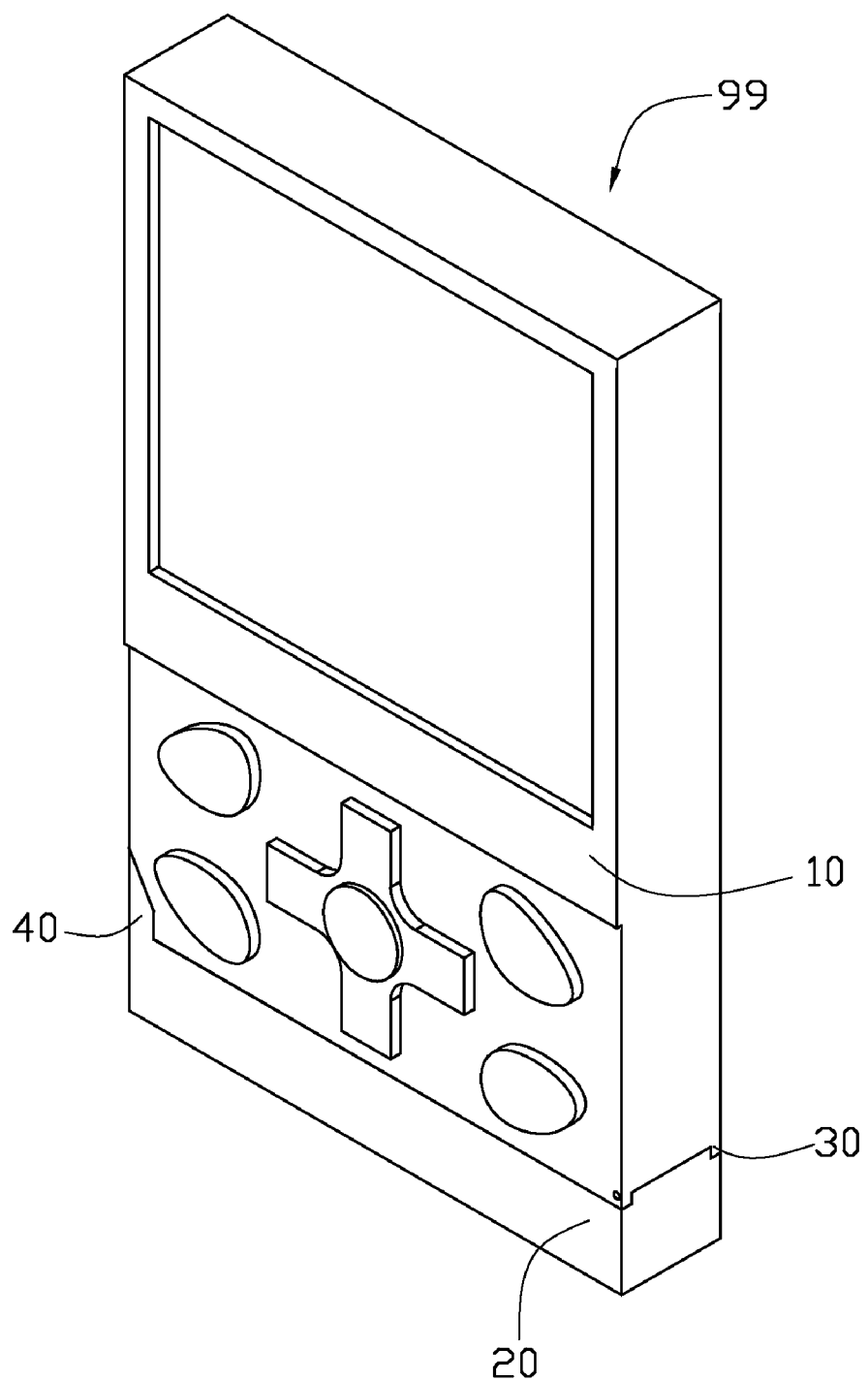
FIG. 1 is a schematic view of one embodiment of a portable electronic device with a compartment being attached to a main body thereof.
Figure 2:
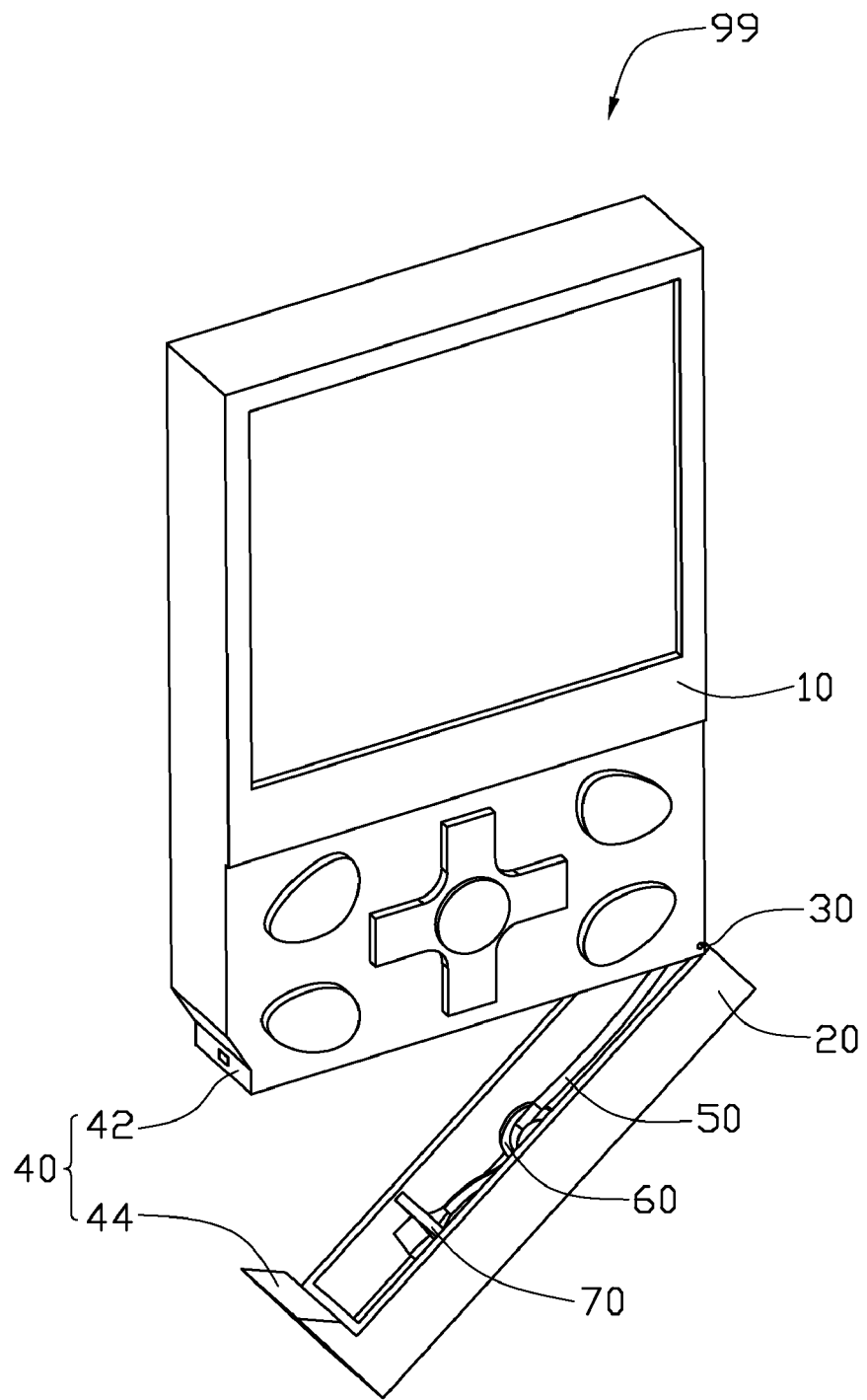
FIG. 2 is a schematic view of the portable electronic device in FIG. 1 with the compartment being unlocked from the main body thereof.

Referring to FIG. 1 and FIG. 2, a portable electronic device 99 includes a main body 10, a compartment 20 and a transmission line 50. A printed circuit board (not shown) is contained within the main body 10. The transmission line 50 is electrically connected with the printed circuit board. The compartment 20 is pivotally connected to one end of the main body 10 by a pivotal shaft 30. The compartment 20 can also be locked to or unlocked from the other end of the main body 10 by a locking mechanism 40. Accordingly, the compartment 20 can be in two positions consisting of a closed position and an open position relative to the main body 10. The transmission line 50 is concealed inside the compartment 20 when the compartment 20 is in the closed position, and disengageable from the compartment 20 when the compartment 20 is in the open position. As such, it is convenient to carry the transmission line 50. The portable electronic device 99 may be a mobile telephone, a music player or other portable electronic devices.

Figure 3:
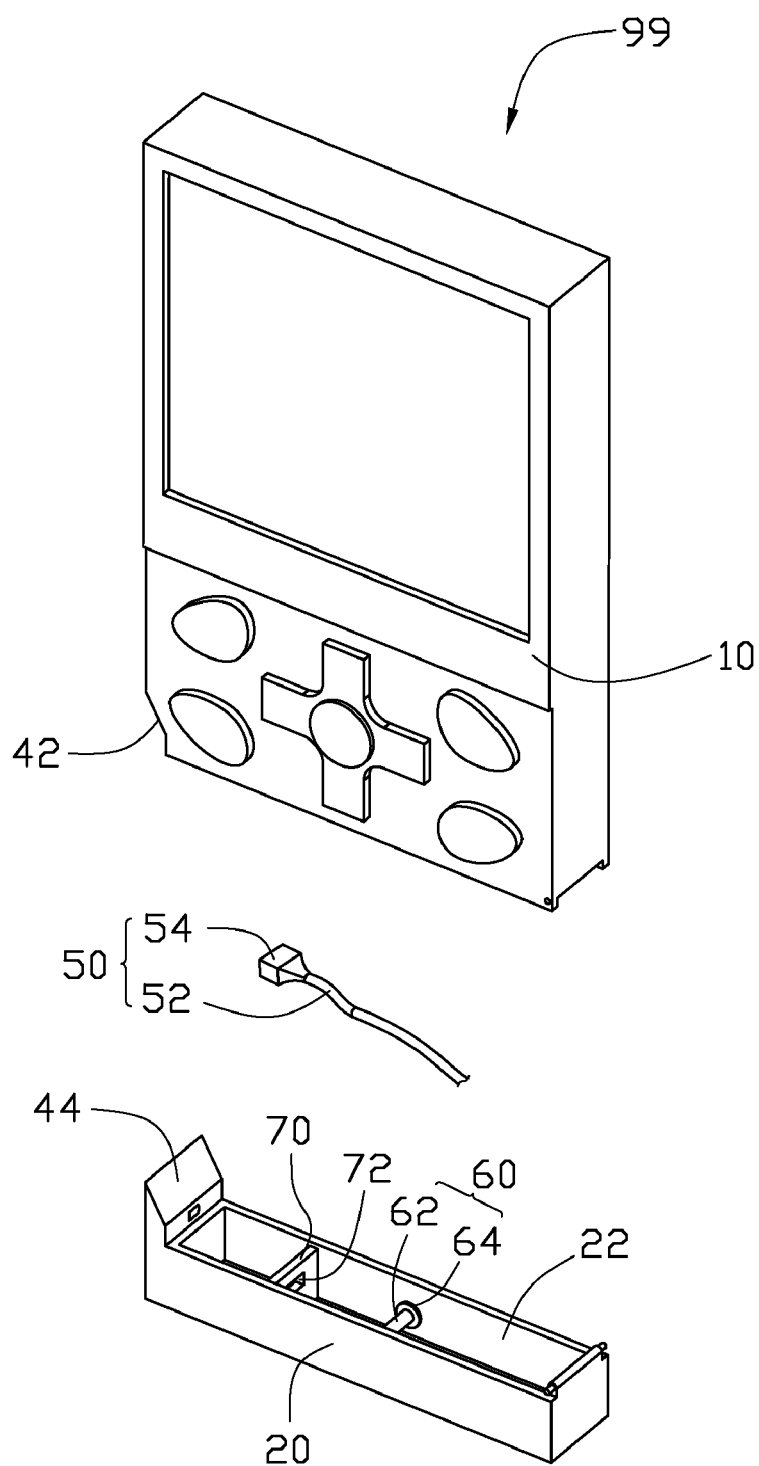
FIG. 3 is an exploded perspective view showing detail structure of the compartment and a transmission line of the portable electronic device in FIG. 1.

Further referring to FIG. 3, the compartment 20 comprises a bottom wall, two elongated side walls on opposite sides of the compartment 20, and two shortened side walls between the elongated sidewalls correspondingly. The four side walls of the compartment 20 perpendicularly extend upwards from four edges of the bottom wall. The bottom wall and the four side walls cooperatively define a receiving space 22 for receiving the transmission line 50. The receiving space 22 defines an opening that faces the end of the main body 10 when the compartment 20 is in the closed position. The transmission line 50 is receivable in the receiving space 22 of the compartment 20 before the compartment 20 is rotated around the pivotal shaft 30 from the open position to the closed position.

Figure 4:
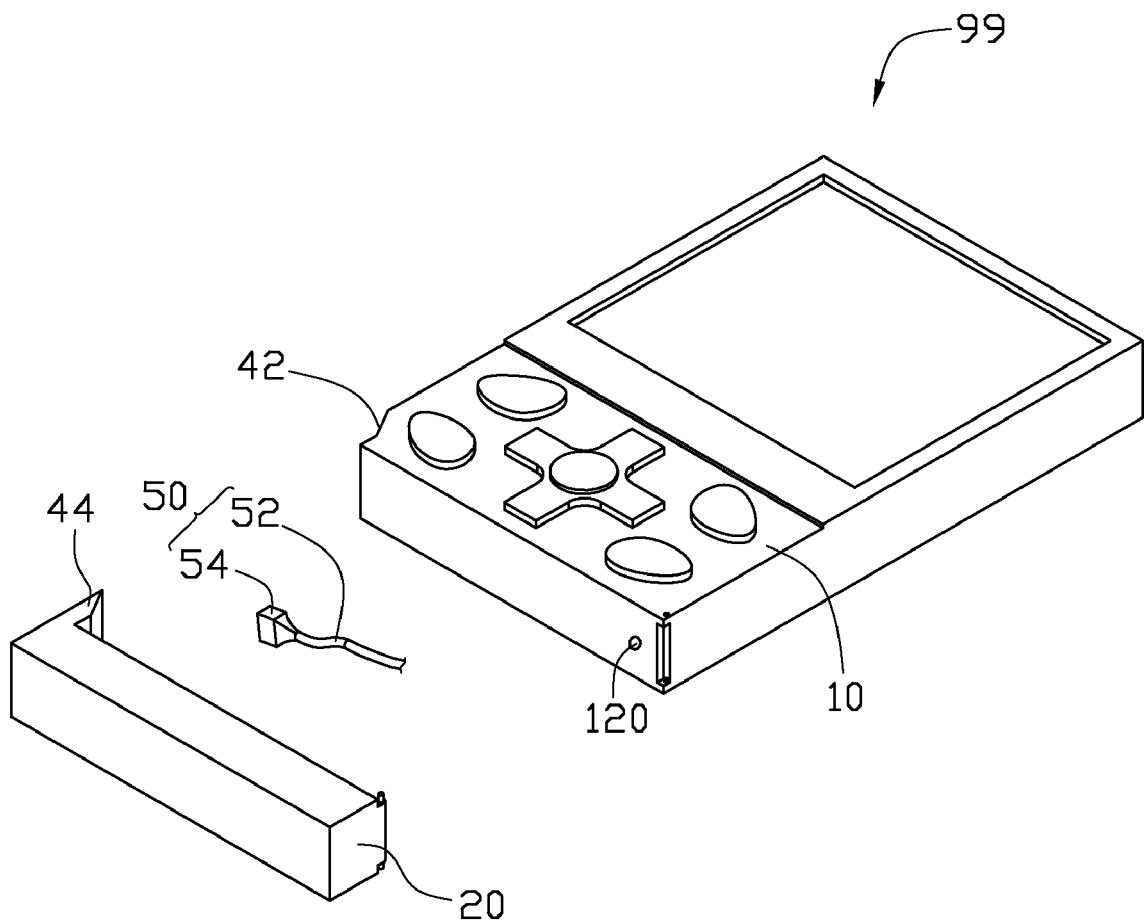
FIG. 4 is another exploded perspective view similar to FIG. 3, but viewed from a rear aspect.

The transmission line 50 includes a cable 52 and a connector part 54. The connector part 54 is commonly a plug, but may also be a port. One end of the cable 52 is electrically connected to the printed circuit board contained in the main body 10, and the other end of the cable 52 extends out from the end of the main body 10 via a through hole 120 (shown in FIG. 4) and fixedly connected to the connector part 54. The cable 52 is for extending the connector part 54 to detachably couple to an external device such as a computer host when the compartment 20 is in the open position.

Figure 5:
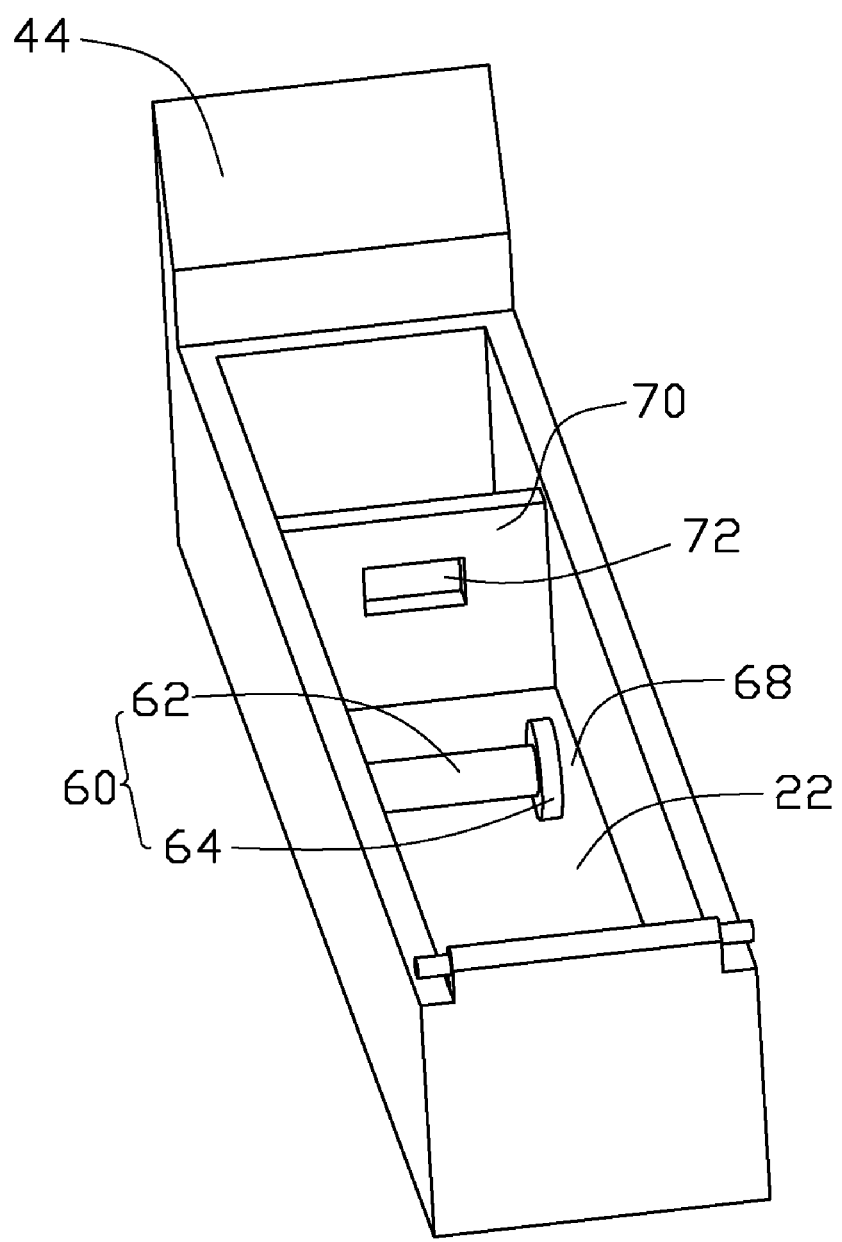
FIG. 5 is a partially enlarged isometric view of FIG. 3, viewed from another aspect.

The compartment 20 further defines a winding mechanism 60 inside the receiving space 22, for winding the cable 52. In this embodiment, the winding mechanism 60 comprises a spool 62 and a rim portion 64. The spool 62 extends perpendicularly from one of the two elongated side walls towards the other of the two elongated side walls. A gap 68 is defined between a free end of the spool 62 and the other of the two elongated side walls (shown in FIG. 5). A width of the gap 68, such as 3 millimeters, is greater than a diameter of a cross section of the cable 52. The cable 52 is winded around the spool 62. The rim portion 64 protrudes from a periphery of the spool 62 at the free end of the spool 62, for preventing the cable 52 from sliding out of the spool 62. As such, the cable 52 is tidily held in the receiving space 22 of the compartment 20.

The compartment 20 further defines a restricting member 70 secured between the two elongated side walls of the compartment 20. The restricting member 70 defines a holding portion 72 for holding the connector part 54. In this embodiment, the restricting member 70 is a rectangle wall clamped between the two elongated side walls of the compartment 20, and the holding portion 72 is a through hole defined on the restricting member 70. A diameter of the through hole is greater than that of the cross section of the cable 52 and smaller than that of a cross section of the connector part 54. Thus, the transmission line 50 is passable through the through hole 72 with the connector part 54 held in the through hole 72. As such, it is convenient for users to locate and extend the connector part 54.

The locking mechanism 40 includes a first locking portion 42 and a second locking portion 44. The first locking portion 42 and the second locking portion 44 cooperate with each other to lock the compartment 20 to the main body 10. In this embodiment, the first locking portion 42 is a notch formed at one end of the main body 10, and the second locking portion 44 protrudes from one of the two shortened side walls of the compartment 20.

Although certain inventive embodiments of the present disclosure have been specifically described, the present disclosure is not to be construed as being limited thereto. Various changes or modifications can be made to the present disclosure without departing from the scope and spirit of the present disclosure.

What is claimed is:

1. A portable electronic device comprising:
   a main body;
   a transmission line having a cable and a connector part, one end of the cable being electrically connected to the main body, the other end of the cable extending out from the main body and being connected to the connector part; and
   a compartment defining a receiving space and a restricting member with a holding portion therein, the compartment being pivotally connected to one end of the main body and having a closed position and an open position relative to the end of the main body, wherein the connector part and the cable are received in the receiving space and concealed by the compartment, and the connector part is held by the holding portion when the compartment is in the closed position, and the connector part is detachably connected to an external device with the cable being pulled out from the receiving space of the compartment when the compartment is in the open position;
   wherein the compartment comprises a bottom wall, two elongated side walls on opposite sides of the compartment and two shortened side walls between the elongated side walls correspondingly, and the four side walls perpendicularly extend upwards from four edges of the bottom wall and cooperatively define the receiving space; the compartment further defines a winding mechanism therein for winding the cable; the winding mechanism comprises a spool extended perpendicularly from one of the two elongated side walls towards the other of the two elongated side walls, and a gap is defined between a free end of the spool and the other of the two elongated side walls; and the restricting member is secured between the two elongated side walls.

2. The portable electronic device of claim 1, further comprising a locking mechanism locking the compartment to the main body when the compartment is in the closed position.

3. The portable electronic device of claim 1, wherein the holding portion is a through hole defined in the restricting member, and the connector part is held in the through hole when the compartment is in the closed position.

4. The portable electronic device of claim 2, wherein the locking mechanism comprises a first locking portion and a second locking portion respectively defined on the main body and the compartment, and the first locking portion and the second locking portion cooperate with each other to lock the compartment to the main body.

5. The portable electronic device of claim 4, wherein the first locking portion is a notch formed at the end of the main body, and the second locking portion protrudes from one of the two shortened side walls of the compartment.

6. The portable electronic device of claim 3, wherein the through hole larger than the cable and smaller than the connector part.

7. A portable electronic device comprising:
   a main body;
   a compartment pivotally connected to one end of the main body, the compartment comprising a restricting member with a holding portion; and
   a transmission line having a connector part and a cable, the connector part being electrically connected to the main body via the cable, wherein the connector part and the cable are able to be held inside the compartment, and the connector part is held by the holding portion when the compartment is locked to the end of the main body, and disengageable from the compartment when the compartment is unlocked to the end of the main body;
   wherein the compartment is rectangular cuboid shaped and defines a hollow space for holding the connector part and the cable, and an opening that faces the end of the main body is defined in the compartment; the compartment defines a winding mechanism inside the hollow space for winding the cable; the winding mechanism comprises a spool extended perpendicularly from one of two elongated side walls on opposite sides of the compartment, and a gap is defined between a free end of the spool and the other of the two elongated side walls; and the restricting member is secured between the two elongated side walls.

8. The portable electronic device of claim 7, further comprising a locking mechanism for cooperatively locking the compartment to the end of the main body, the locking mechanism comprising a first locking portion and a second locking portion respectively defined on the end of the main body and the compartment.

9. The portable electronic device of claim 7, wherein the holding portion is a through hole defined in the restricting member, and the connector part is held in the through hole when the compartment is in the closed position.

10. The portable electronic device of claim 8, wherein the first locking portion is a notch formed at one end of the main body, and the second locking portion protrudes from one of two shortened side walls between the two elongated side walls correspondingly.

* * * * *